United States Patent [19]

Calvert et al.

[11] Patent Number: 4,839,598

[45] Date of Patent: Jun. 13, 1989

[54] METHOD FOR TESTING UNDERGROUND ELECTRIC CABLES

[75] Inventors: Douglas D. Calvert, Wales; Edward A. Behrens, Milwaukee; Donald K. Baver, Wauwatosa, all of Wis.

[73] Assignee: Wisconsin Electric Power Company, Milwaukee, Wis.

[21] Appl. No.: 152,979

[22] Filed: Feb. 8, 1988

[51] Int. Cl.[4] ............................................. G01R 31/08
[52] U.S. Cl. ..................................... 324/539; 324/530; 324/523; 324/522
[58] Field of Search ............... 324/522, 523, 528, 530, 324/539, 541, 544

[56] References Cited

U.S. PATENT DOCUMENTS

| | | | |
|---|---|---|---|
| 1,745,419 | 2/1930 | Henneberger. | |
| 2,635,135 | 4/1953 | Lamont | 324/539 |
| 3,299,351 | 1/1967 | Williams | 324/52 |
| 3,792,350 | 2/1974 | Bossler et al. | 324/52 |
| 3,860,866 | 1/1975 | Dornberger | 324/52 |
| 3,924,179 | 12/1975 | Dozier | 324/66 |
| 3,982,180 | 9/1976 | Vaiden | 324/522 |
| 3,991,363 | 11/1976 | Lathrop | 324/52 |
| 4,063,161 | 12/1977 | Pardis | 324/52 |
| 4,184,143 | 1/1980 | Stafford | 324/539 |
| 4,295,095 | 10/1981 | Thomas et al. | 324/326 |
| 4,520,317 | 5/1985 | Peterman | 324/326 |

FOREIGN PATENT DOCUMENTS

| | | | |
|---|---|---|---|
| 475745 | 7/1951 | Canada | 324/523 |
| 158571 | 12/1980 | Japan | 324/522 |
| 813326 | 3/1981 | U.S.S.R. | 324/523 |
| 970278 | 10/1982 | U.S.S.R. | 324/522 |

Primary Examiner—Reinhard J. Eisenzopf
Assistant Examiner—Maura K. Regan
Attorney, Agent, or Firm—Quarles & Brady

[57] ABSTRACT

Breaks in the bare neutral conductor of an underground electric cable can be located by applying an alternating signal across the neutral conductor and a phase conductor at one end of the cable. The neutral and phase conductors are connected together at the other end of the cable. The electrical potential of the alternative signal is measured at a series of spaced apart points on the earth's surface along the cable's path. The potential between points over a cable section with an open in the neutral conductor will be about two orders of magnitude greater than the potential between points above good cable section.

9 Claims, 2 Drawing Sheets

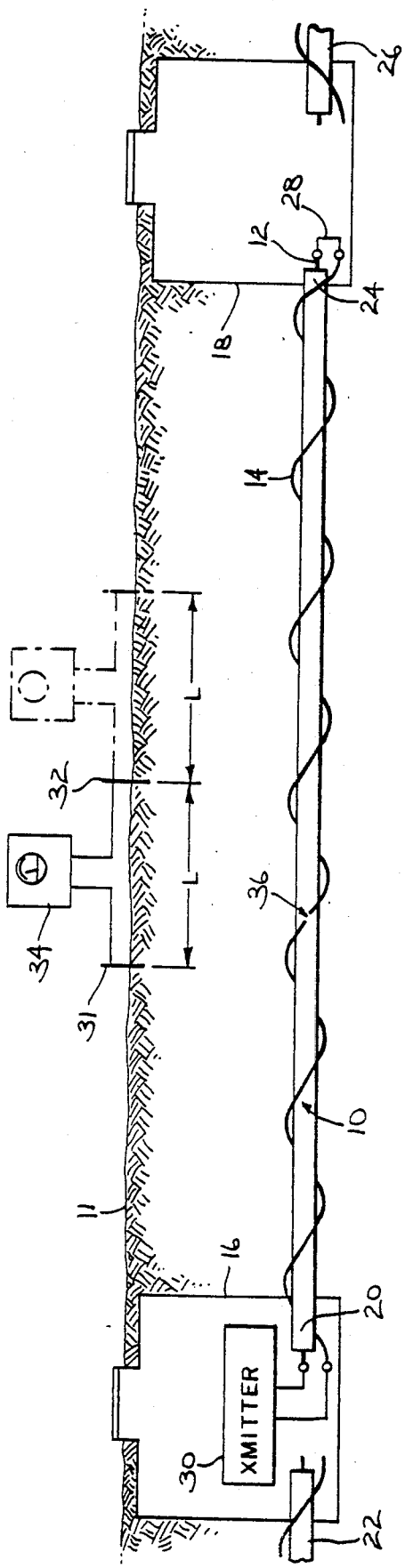
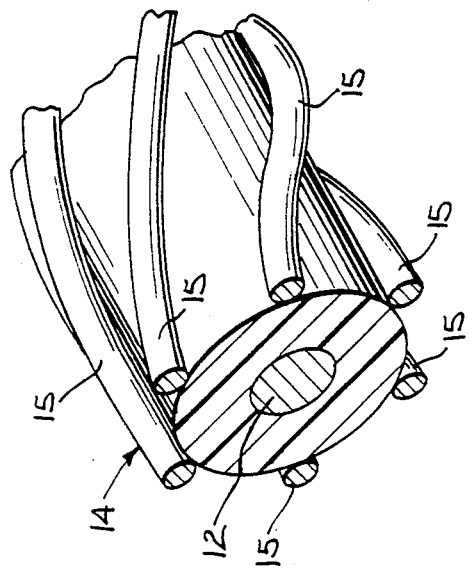
FIG. 1
FIG. 2

METHOD FOR TESTING UNDERGROUND ELECTRIC CABLES

BACKGROUND OF THE INVENTION

The present invention relates to the testing of buried electrical cables in order to detect faults in the cable.

For esthetic and other reasons, electric utility cables are often buried underground running thousands of feet between terminal points. High voltage cables typically have two conductors, an insulated phase conductor and a bare neutral conductor consisting of a number of wires that are separately helically wound about the length of the first conductor. The neutral conductor also acts as a shield for the phase conductor against electrical stress. This type of cable is commonly referred to as a concentric neutral cable. Three such cables are employed for three phase electrical service.

Although this type of concentric neutral cable which employs a bare neutral conductor is relatively inexpensive compared to providing an insulated neutral conductor, the bare conductor is prone to corrosion. After prolonged exposure to certain types of soil conditions, the wires of the bare neutral conductor begin to corrode eventually producing an open circuit. Not only does the breakage of even a few neutral wires affect the current carrying capacity of the neutral conductor, but the shielding of the phase conductor is also degraded.

Because the cable is buried, visual observation cannot be employed to detect the location of a break or to forwarn of the onset of significant corrosion. Although conventional resistivity measurements can be employed to detect the section of cable in which breaks in the neutral conductor wires occur, such techniques cannot pinpoint the precise location of the breaks. It is relatively expensive and time consuming to dig up long sections of the cable in order to pinpoint the location of significant corrosion in the concentric neutral conductor.

Equipment is available for detecting breaks in insulated cable which is buried underground. Such equipment couples an alternating signal at a given frequency between an insulated conductor of the cable and earth ground at one end of the cable. The other end of the insulated conductor is connected directly to earth ground. The signal flows into the earth at the point of a fault in the conductor insulation creating a voltage potential variation between probes inserted in the earth at different locations above the cable's path. This potential change is detected in order to locate the break. This technique cannot be applied to detect faults in bare neutral conductors as the signal will flow into the ground all along the conductor.

SUMMARY OF THE INVENTION

The present invention is directed to a method for testing underground electrical cables to detect corrosion of the conductors. The type of cable to which the present invention is particularly well suited has an insulated first conductor and a bare second conductor. In order to test a section of the cable, the first and second conductors are connected together at one end of the section. At the other end, an alternating electrical signal is applied between the two conductors. The frequency of the alternating signal is selected so that the soil will have a relatively high impedance at that frequency, thus maximizing the potential gradient.

Two probes are inserted in the surface of the earth at spaced apart locations along the path of the cable. The potential difference between the two probes is then sensed at the frequency of the alternating electrical signal. The probes are then sequentially inserted in different locations in the earth along the path of the cable and the potential difference between the probes is then sensed for these various locations. This potential difference at each location corresponds to the voltage drop along the section of cable beneath the probes. The sensed potential increases by about two orders of magnitude between a good section of cable and one having a break in the neutral conductor.

BRIEF DESCRIPTION OF THE DRAWINGS

FIG. 1 illustrates an underground cable undergoing testing according to the present invention;

FIG. 2 is an enlarged view of the underground cable of FIG. 1;

DETAILED DESCRIPTION OF THE PRESENT INVENTION

Figure 3:
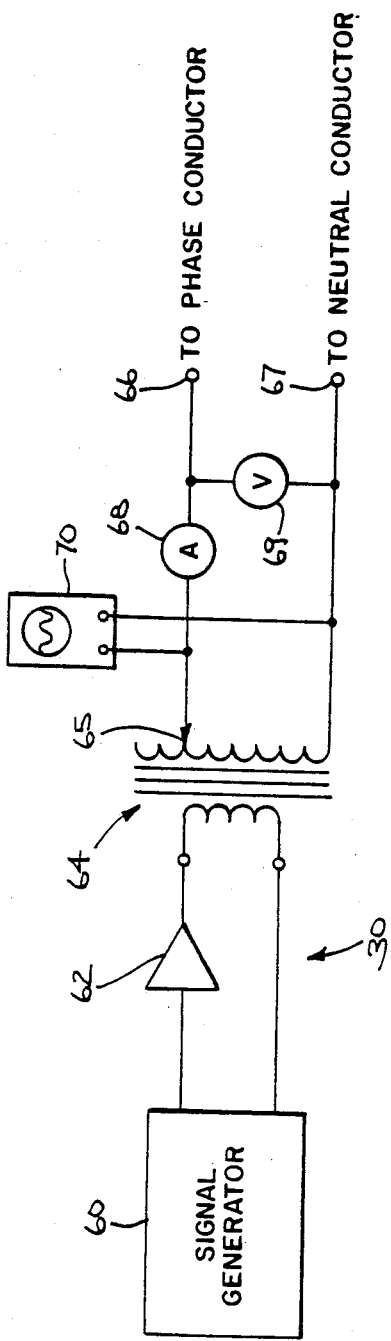
FIG. 3 is a block schematic diagram of part of the apparatus used in practicing the present testing method.

With reference to FIG. 1, a section of underground cable, generally designated as 10, is located several feet beneath the surface 11 of the earth. This cable consists of an insulated phase conductor 12 and a neutral conductor 14 consisting of a plurality of bare wires 15 helically wound around the first conductor, as shown in FIG. 2. All of the bare wires 15 are connected together at the ends of the cable. For ease of illustration, the second conductor in FIGS. 1 and 4 has been shown as a single helix. The section of cable 10 in FIG. 1 extends between two terminal points, such as underground cable vaults 16 and 18, which in a typical installation can be up to two miles apart. In other installations, the section of cable may run between poles where it connects to overhead wires, or between electrical distribution equipment. A first end 20 of the cable 10 extends into the first cable vault 16 where it is normally connected to another cable 22 to form an electric circuit. The other end 24 of the cable 10 extends into the second cable vault 18 where it is normally connected to another electrical cable 26.

In preparation to test the cable 10, it is disconnected at each of the cable vaults 16 and 18 from the other cables 22 and 26, so as to isolate that cable. Not only is the phase conductor 12 disconnected, but the neutral conductor 14 is disconnected from the other cables 22 and 26 and from any ground connection as well. Then, conventional techniques are employed to locate the cable along its path between the two vaults and the path is marked accordingly on the surface 11 of the earth. After the section of cable 10 is disconnected at each of the cable vaults, the two conductors 12 and 14 are connected together by a jumper 28 at the other end 24 of the cable. Similarly, at the first end 20 of the cable 10, a signal transmitter 30 is connected so as to apply an alternating signal between the phase and neutral conductors 12 and 14.

The transmitter 30, shown in detail in FIG. 2, includes a signal generator 60, which emits an output signal at a frequency in the range 500 Hz to 2000 Hz. Typically, the earth has a resistivity which can range from 1,000 ohms to 100,000 ohms centimeters at 60 Hz and can vary dramatically along a section of cable. The frequency of the generator 60 is chosen such that the earth resistivity will be maximized at this frequency regardless of variaton in soil types. Preferably the output signal of the signal generator 60 is in the 800 Hz to 1100 Hz range (e.g. 810 Hz).

The output of the signal generator 60 is coupled by an amplifier 62 to an impedance matching transformer 64. The amplifier boosts the current of the signal to 10 amperes. In order to efficiently couple the amplified output of the signal generator to the cable 10, the output impedance of the transmitter 30 at terminals 66 and 67 must be matched to the impedance of the cable. The impedance of the cable 10 varies depending upon its length and the size of the conductors, as well as the condition of the cable. Initially, the impedance is approximated by a d.c. resistance measurement and the output winding 65 of the transformer 64 is adjusted to this impedance. The transmitter 30 is then connected by terminals 66 and 67 to the phase and neutral conductors 12 and 14 of the cable 10. The signal is applied to the cable and the output winding 65 is adjusted for maximum power output as indicated by ammeter 68 and voltmeter 69. An oscilloscope 70 is also connected across the output terminals 66 and 67 of transmitter 30 to indicate signal distortion which can be corrected by decreasing the transmitter's output power. The cable 10 acts as a transmission medium for the transmitter signal with the signal being carried out on one of the two conductors 12 or 14 and returned on the other conductor. Because the resistivity of the earth is significantly greater than the resistivity of the bare neutral conductor, the signal current will tend to flow through the conductor rather than through the earth, except at points where the neutral conductor is broken.

Once the connections to the cable have been made, the operator then proceeds above ground. Beginning either at one end of the section of cable 10 or near the location of a suspected problem, two metal probes 31 and 32 are inserted into the earth three to four inches below the surface 11. The two probes 31 and 32 are spaced apart a distance L, e.g. initially 100 feet. For optimum results, the probes should be placed above the cable along a line that is substantially parallel to the path of the cable 10. However, the present invention does not require that the two probes 31 and 32 be placed precisely above the cable over or along a line that is exactly parallel to the cable 10.

A frequency selective voltmeter 34, such as a Harmon model 4200B, tuned to the signal generator frequency is connected between the two probes 31 and 32 to measure the electrical potential therebetween at that frequency. By employing a tuned narrow bandwidth voltmeter 34, any signals at other frequencies within the earth, such as those emitted by other electrical cables, telephone lines, or buried CATV cables, will not affect the voltmeter operation. The operator notes the potential measured by the voltmeter 34 at the first location of the probes.

The probes 31 and 32 are then moved to a second adjacent location as indicated by phantom lines on FIG. 1. This can be most efficiently accomplished by moving the second probe 32 to a new location a distance L from its original location and placing the first probe 31 into the hole left by the second probe at its original location. By repeating this process, the electrical potentials are measured between successive locations on the earth surface along the length of the cable 10.

Each successive measurement indicates the applied signal voltage drop along the portion of the cable beneath the measurement location. This voltage drop will increase in sections of the cable with breaks or significant corrosion of the neutral conductor wires 15 which increase the cable's resistance. The potential between the probes which are over a portion of the cable that has breaks in several of the wires 15 of the bare neutral conductor 14, such as at point 36, will be approximately two orders of magnitude greater than the potential between the probes over a good section of cable. Therefore, by noting the potential between successive increments above the cable, the increment over the point of the significant cable corrosion can be located by noting a sharp increase in the measured potential. Once a neutral conductor break has been located between the probes at distance L, the probes then can be placed closer together to home in on the exact point of the break. Here also, a markedly higher measured potential indicates the position on the surface 11 of the earth that is above the location of the break in the bare neutral conductor 14.

While it is noted that the difference in potential between a good section of cable and one that has a significant number of breaks in the wires 15 of the bare neutral conductor 14 is approximately two orders of magnitude, the present inventors have found that a difference in potentials of approximately one order of magnitude indicates a portion of cable with a severely degraded bare neutral conductor. The degree of degradation is proportional to the magnitude of the sensed voltage. The number of bare wires 15 that are broken or the degree of their corrosion is reflected in the magnitude of the potential sensed at the surface. This indication may be employed to locate latent problems prior to a catastrophic failure so that repair to the cable may be effected before such failure.

Figure 4:
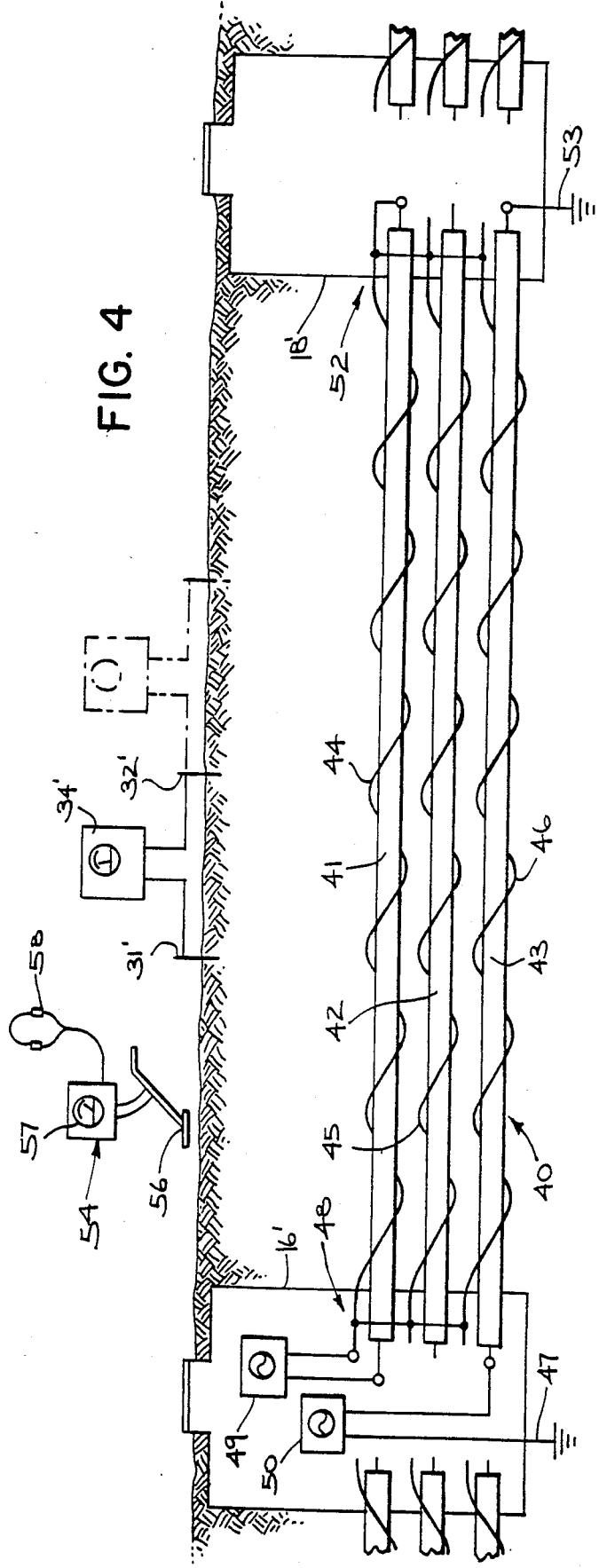
FIG. 4 illustrates a three phase electric cable undergoing testing.

With reference to FIG. 4, the present underground cable testing system also can be applied to three-phase electric lines having bare concentric neutral cables. With this type of line a second electrical signal can be applied simultaneously to one cable to aid in locating it from the surface so that the fault detection probes 31 and 32 can be accurately positioned.

As shown, a three-phase electric line 40 consists of three insulated phase conductors 41–43 and a bare neutral conductor 44–46 wound in a helical manner about each of the three phase conductors respectively. The electric line 40 extends between two cable vaults 16', and 18' similar to those shown in FIG. 1. In the first cable vault 16' a cable testing signal transmitter 49 of the type shown in FIG. 3 applies a signal between one of the phase conductors 41 and the three neutral conductors 44–46 which are coupled together at the first end 48 of the cable 40. A cable locator signal transmitter 50, which is similar to the transmitter shown in FIG. 3, applies an output signal between the third phase conductor 43 and a direct connection 47 to earth ground. The signal transmitters 49 and 50 produce different output signals in the frequency range between 500 Hz and 2000 Hz. For example, the first transmitter 49, which is used for fault detection, produces a first signal at 810 Hz and the second transmitter 50, which is used to locate the cable, produces a second signal at 980 Hz.

At the second cable vault 18' the three neutral conductors 44–46 are directly connected to the first phase conductor 41 at the other end 52 of the electric line 40. The other end of the third phase conductor 43 is directly connected at point 53 to earth ground.

Once the connections to the electric line 40 in FIG. 3 have been made, a conventional underground cable locating receiver 54 is employed to locate the general position of the underground cable from the surface of the earth. This receiver 54 is tuned to the frequency of the second signal transmitter 50 and has a pickup coil 56 which is coupled to the receiver. The operator moves the pickup coil 56 above the surface of the ground over the suspected location of the underground electric line 40. Depending upon the type of receiver 54 used, a peak or a null of the second signal strength will be indicated on meter 57 or headphones 58 when the pickup coil 56 is directly above the electric line 40. This conventional technique is used to pinpoint the path of the electric line on the surface of the earth.

After the path of a portion of the electric line 40 has been found, the two probes 31' and 32' are inserted into the earth along that path. The electrical potential between the two probes 31' and 32' is then sensed by a frequency selective voltmeter 34' which is tuned to the frequency of the first signal generator 49. As with the method for a single phase cable in FIG. 1, the probes 31' and 32' are moved to a series of locations along the surface of the earth above the electric line 40 and the potential reading at each successive location is noted. The break detection method with this three-phase electric line is the same as with respect to the single-phase cable in FIG. 1 in that a significant increase in the measured potential indicates a region in which a break occurs in one of the bare neutral conductors 44-46. However, with the three-phase electric line, one of the phase conductors 43 may be used to carry a second electrical signal for cable location purposes and it is possible to detect the location of the cable at the same time that the probes 31' and 32' are being sequentially moved along the surface above the electric line. In this combined process, the effort involved in testing the cables in that the act of cable location and break detection are not sequentially separate operations.

We claim:

1. A method for testing underground electric cables having an insulated first conductor and a bare second conductor, said method comprising the steps of:
    (a) coupling the first conductor to the second conductor at one end of the cable;
    (b) applying an electrical signal between the first and second conductors at the other end of the cable, the electrical signal having a given frequency; and
    (c) measuring the potential difference at the given frequency of the electrical signal between two spaced apart locations at the surface of the earth along the path of the cable.

2. The method as recited in claim 1 wherein the measuring step comprises inserting two probes into the earth and sensing the potential difference between the two probes.

3. The method as recited in claim 1 wherein the frequency of the alternating electrical signal is in the range of 500 Hz to 2000 Hz.

4. The method as recited in claim 1 further comprising the step of measuring the potential difference between a series of spaced apart locations along the path of the cable to determine between which pair of locations an increase in the potential difference occurs.

5. The method as recited in claim 1 wherein the electrical signal at a given frequency is continuously applied to the cable.

6. A method for testing underground electric cables having first and second insulated conductors and a bare third conductor, said method comprising the steps of:
    connecting the bare third electrical conductor to the first conductor at a first end of the cable;
    applying an alternating electrical signal at a first frequency between the third electrical conductor and the first electrical conductor at the other end of the cable;
    detecting the potential difference at the first frequency between a series of points on the surface of the earth to determine the location of a potential increase along the path of the cable;
    connecting the second conductor to earth ground at one of the first and second ends of the cable;
    applying a alternating electrical signal at a second frequency between the second conductors and earth ground at the other one of the first and second ends of the cable; and
    sensing the signal at the second frequency on the surface of the earth along the path of the cable.

7. The method as in claim 6 wherein the first and second electrical signals have different frequencies within the range of 500 Hz to 2000 Hz.

8. A method for testing underground electric cables having an insulated first conductor and a bare second conductor, said method comprising the steps of:
    (a) coupling the first conductor to the second conductor at one end of the cable;
    (b) applying an electrical signal between the first and second conductors at the other end of the cable the electrical signal having a given frequency; and
    (c) sensing the electrical signal at the surface of the earth to determine the voltage drop between a plurality of points along the cable.

9. The method as recited in claim 8 wherein said sensing step comprises measuring the potential difference at the given frequency between two locations on the surface of the ground substantially above the cable.

* * * * *